United States Patent
Hastings (10) Patent No.: US 8,305,133 B2
(45) Date of Patent: Nov. 6, 2012

(54) IMPLEMENTING A PIECEWISE-POLYNOMIAL-CONTINUOUS FUNCTION IN A TRANSLINEAR CIRCUIT

(75) Inventor: Roy Alan Hastings, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 155 days.

(21) Appl. No.: 12/924,639

(22) Filed: Oct. 1, 2010

(65) Prior Publication Data

US 2012/0081168 A1  Apr. 5, 2012

(51) Int. Cl.
H03L 7/06 (2006.01)
(52) U.S. Cl. ......... 327/346; 327/347; 327/348; 327/349
(58) Field of Classification Search ........... 327/346–349
See application file for complete search history.

(56) References Cited

U.S. PATENT DOCUMENTS

| | | | |
|---|---|---|---|
| 5,134,355 A | | 7/1992 | Hastings |
| 5,442,311 A | * | 8/1995 | Trafton .................. 327/306 |
| 5,999,053 A | * | 12/1999 | Eschauzier ............ 330/254 |
| 6,084,471 A | * | 7/2000 | Ruth et al. ............. 330/254 |
| 6,861,890 B2 | * | 3/2005 | Gilbert ................... 327/349 |
| 6,882,185 B1 | * | 4/2005 | Walker et al. .......... 327/103 |
| 7,002,394 B1 | * | 2/2006 | Gilbert ................... 327/349 |
| 7,301,387 B2 | * | 11/2007 | Zou ....................... 327/349 |
| 7,327,183 B2 | * | 2/2008 | Gilbert ................... 327/349 |
| 7,352,231 B2 | * | 4/2008 | Hastings ................ 327/346 |
| 7,969,223 B1 | * | 6/2011 | Gilbert ................... 327/350 |
| 2005/0007177 A1 | * | 1/2005 | Hastings ................ 327/346 |
| 2007/0090868 A1 | * | 4/2007 | Zou ....................... 327/349 |
| 2008/0136491 A1 | * | 6/2008 | Zou ....................... 327/349 |
| 2012/0081168 A1 | * | 4/2012 | Hastings ................ 327/346 |

OTHER PUBLICATIONS

Hot Swap & System Protection/Monitoring Controllers Featuring The LM(2)506x Family, http://www.national.com/analog/power/hv/hot_swap, 2010, pp. 1-3, National Semiconductor Corporation.
Joel L. Dawson, 6.301 Solid-State Circuits, Recitation 19: More on Translinear Circuits, pp. 1-5.
Positive High-Voltage Power—Limiting Hotswap Controller, SLVS503B, TPS2490 TPS2491, Nov. 2003, pp. 1-23, Texas Instruments Incorporated, Dallas, Texas.
Translinear circuit, Wikipedia, the free encyclopedia, http://en.wikipedia.org/wiki/Translinear_circuit, Nov. 23, 2009, pp. 1-6.

* cited by examiner

*Primary Examiner* — Lincoln Donovan
*Assistant Examiner* — Adam Houston
(74) *Attorney, Agent, or Firm* — William B. Kempler; Wade J. Brady, III; Frederick J. Telecky, Jr.

(57) ABSTRACT

Implementing a piecewise-polynomial-continuous function in a translinear circuit generally involves translinear elements that form translinear loops that are linked by a clamp transistor. A first translinear loop controls a first portion of the piecewise-polynomial-continuous function in a first area of operation. A second translinear loop controls a second portion of the piecewise-polynomial-continuous function in a second area of operation. When activated in the second area of operation, the clamp transistor draws current through one of the translinear elements without drawing current away from another translinear element of the translinear circuit.

20 Claims, 6 Drawing Sheets

IMPLEMENTING A PIECEWISE-POLYNOMIAL-CONTINUOUS FUNCTION IN A TRANSLINEAR CIRCUIT

BACKGROUND OF THE INVENTION

A hot swap controller enables a device (e.g. a printed circuit board, a PC card, a drive module, etc.) to be safely inserted into (and removed from) a connector of a host electronic system (e.g. a computer, a server, a communication device, a storage unit, etc.) while the host electronic system is operational. If, for example, a printed circuit board (PCB) does not have a proper hot swap controller, then immediately upon establishing the electrical connection between the PCB and a power source within the host electronic system, an electrical arc (or spark) could occur at the connector and then as the PCB begins drawing power the power level from the power source could temporarily decrease. The arc at the connector and/or the decrease in the power level could cause damage to, or a malfunction of, either the PCB or the host electronic system, among other potential problems. Hot swap controllers are typically designed to prevent such problems, thereby enabling a smooth insertion of the PCB into the host electronic system, without interrupting operations of the host electronic system.

The electrical arc and power decrease problems are typically primarily due to an initial inrush of current to the PCB upon establishing the electrical connection. (And the current inrush is typically primarily due to an initial charging up of various capacitors on the PCB.) In large part, the hot swap controller limits the initial inrush of current to the PCB, thereby preventing these potential problems.

The hot swap controller typically limits the initial inrush of current to the PCB with a MOSFET, sometimes referred to as a "pass FET." The current enters the PCB and passes through the pass FET before proceeding to other components that perform the primary functions of the PCB for the host electronic system. If the current level through the pass FET is too high, however, not only can the initial inrush damage other components on the PCB, but the pass FET may dissipate too much power and potentially overheat and become damaged and/or damage other components on the PCB. The hot swap controller, therefore, typically drives the pass FET within a defined safe operating area (SOA) in order to protect the pass FET as well as to protect other components on the PCB.

There are a variety of known techniques for properly driving the pass FET by the hot swap controller. Each is designed to ensure that the pass FET operates within the SOA. Some of these techniques are relatively simple, but require a relatively large pass FET, which takes up valuable space within the hot swap device. Other, more sophisticated, techniques attempt to closely track the boundaries of the SOA, so the pass FET can be smaller.

In accordance with some of the more sophisticated techniques, the hot swap controller manages the level of current that is allowed to flow through the pass FET during the initial inrush period using current-limiting and power-limiting circuitry that is typically based on a Gilbert translinear circuit (or loop or cell). A Gilbert translinear circuit operates according to the "translinear principle." ("Translinear" generally refers to transconductance that is linear with current.)

The translinear principle states that in a closed loop containing an even number of translinear elements (e.g. BJTs or CMOS transistors in weak inversion) with a first set of the translinear elements arranged to pass current in one direction around the loop and a second set of the translinear elements (in equal number as the first set) arranged to pass current in the opposite direction around the loop, the product of the currents (i.e. the collector currents, IC) through the first set of translinear elements equals the product of the currents through the second set of translinear elements. With BJTs, for instance, an even number of BJTs are arranged so that their base-emitter junctions form a closed loop in which half of the junctions are oriented in one direction around the loop and half in the opposite direction.

Figure 1:
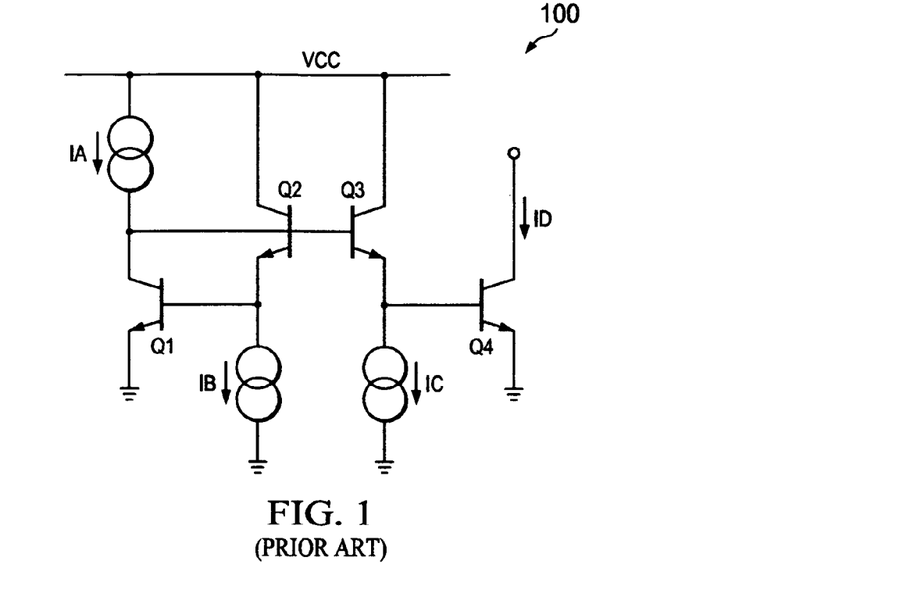
FIG. 1 is a simplified schematic diagram of a prior art translinear circuit.
Figure 2:
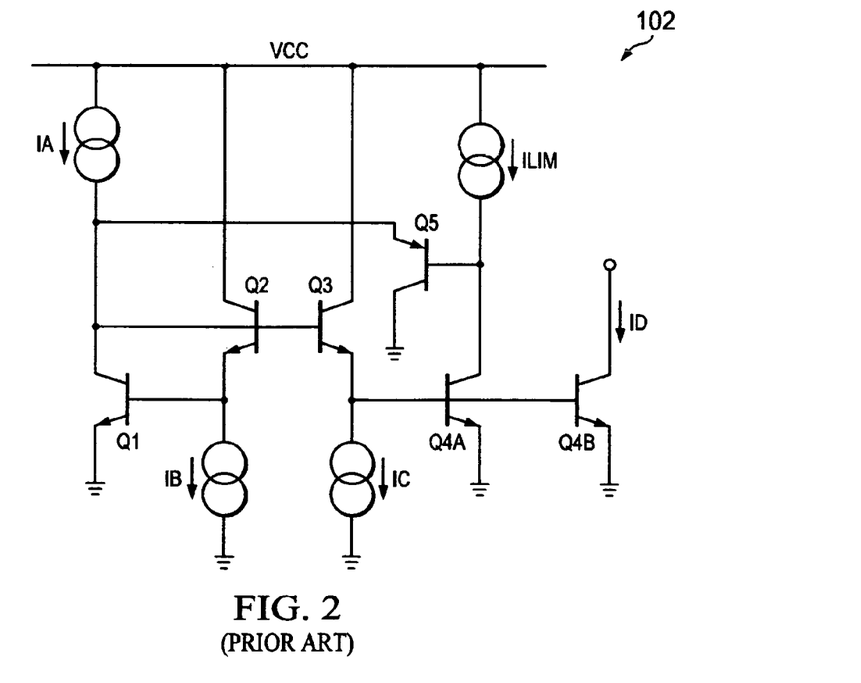
FIG. 2 is a simplified schematic diagram of another prior art translinear circuit.
Figure 3:
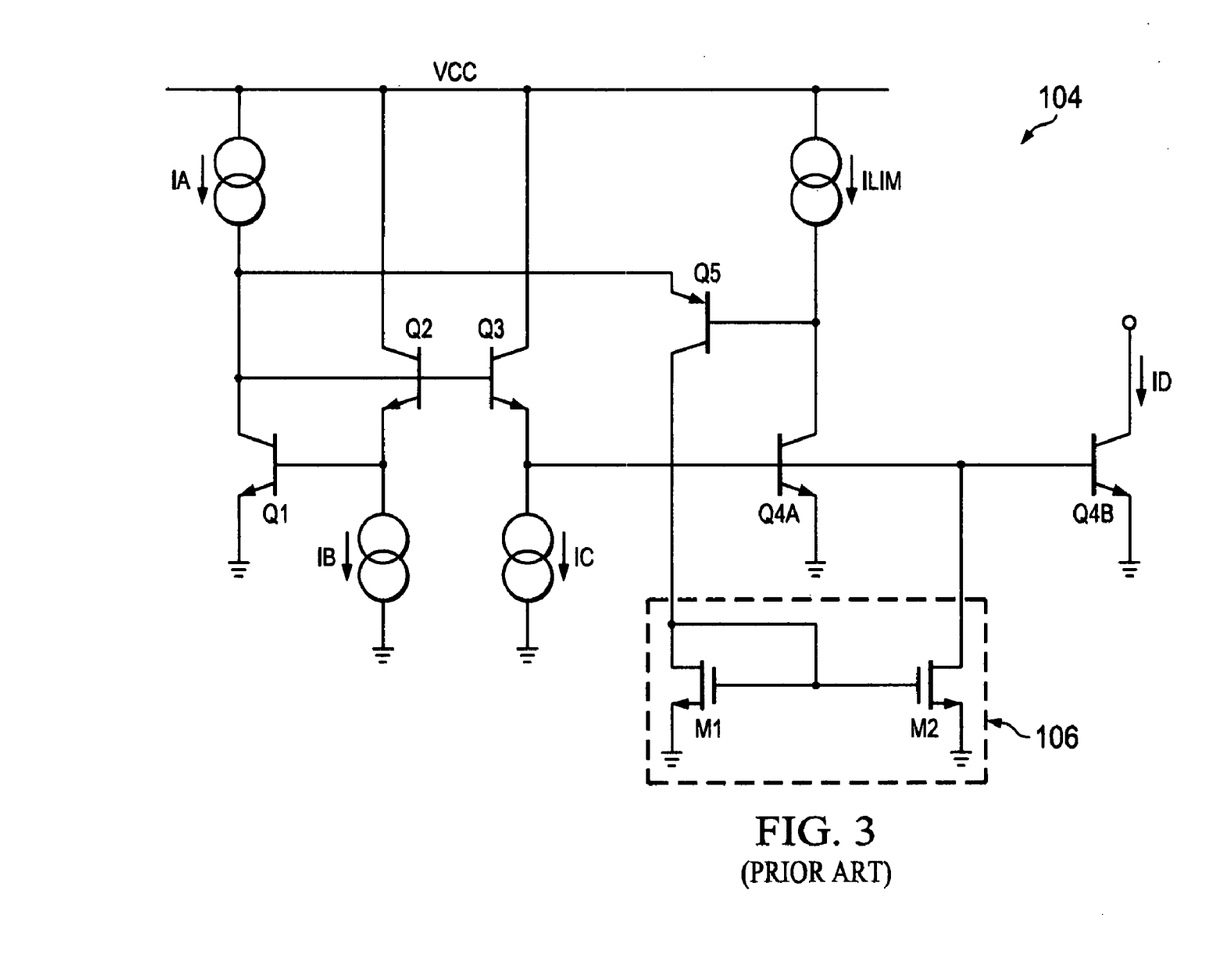
FIG. 3 is a simplified schematic diagram of yet another prior art translinear circuit.

To illustrate this principle, three example translinear circuits 100, 102 and 104 are shown in FIGS. 1, 2 and 3, respectively. Each succeeding translinear circuit (from 100 to 102 to 104) illustrates how the concept of using such circuits 100-104 for current- and power-limiting purposes has evolved as certain problems have been addressed and overcome. With the continued development of hot swap technology, however, a significant issue remains to be addressed, as will be explained below.

In the translinear circuit 100, a closed loop is formed from the node between the bases of NPN BJTs Q2 and Q3 through the base-emitter junctions of NPN BJTs Q2 and Q1 to ground and from ground through the base-emitter junctions of NPN BJTs Q4 and Q3 back to the node between the bases of BJTs Q2 and Q3. (Additional components, e.g. to minimize base currents, may be included, but are not shown for simplicity.) Traversing this loop reveals that the base-emitter junctions of BJTs Q2 and Q1 are oriented in one direction and the base-emitter junctions of BJTs Q4 and Q3 are oriented in the opposite direction. Therefore, according to the translinear principle, the relationship of the collector currents of the BJTs Q1, Q2, Q3 and Q4 can be expressed as (equation 1):

$$IC2 \cdot IC1 = IC4 \cdot IC3$$

(assuming certain parameters, such as high beta, high Early voltage, and equal emitter areas). Substituting the values of the current sources (IA, IB and IC) and solving for the current ID results in (equation 2):

$$ID = \frac{IA \cdot IB}{IC}.$$

It is, therefore, possible to use this translinear circuit 100 as an analog multiplier/divider circuit to determine the current ID as an output based on the other currents IA, IB and IC as inputs. However, a problem exists in the fact that ID tends toward infinity as IC approaches zero, which can result in excessive current draw by the translinear circuit 100 if the translinear circuit 100 were to be used to determine the allowable current through a pass FET of a hot swap controller. In other words, the translinear circuit 100 may determine an allowable power-limiting current through the pass FET based on an allowable power level and a voltage across the pass FET, but does not provide for current-limiting as well. (Additional description related to the translinear circuit 100 can be found in U.S. Pat. No. 7,352,231, since the circuit in FIG. 1A of U.S. Pat. No. 7,352,231 is similar to the translinear circuit 100. U.S. Pat. No. 7,352,231 is assigned to the same assignee as the present invention and is incorporated in its entirety herein by reference.)

Another simple translinear circuit 102, shown in FIG. 2, eliminates the problem of the infinity in the translinear circuit 100 and enables current-limiting as well as power-limiting for the pass FET of a hot swap controller. In this case, the BJTs Q1, Q2, Q3 and Q4B form a first translinear loop and the BJTs Q4A and Q4B form a second translinear loop. The first and second translinear loops are "linked" by a clamp PNP BJT Q5 (a Trafton-Hastings clamp), so that together the linked translinear loops implement the piecewise-polynomial-continuous equation, or function, (equation 3):

$$ID = \min\left(\frac{IA \cdot IB}{IC}, ILIM\right).$$

In other words, due to the link between the first and second translinear loops, the output current ID will be the lesser of the two options given in equation 3, depending on which of the two loops is controlling at any given time. Which of the two loops is controlling generally depends on the level of the collector current of BJT Q4A (IC4A) relative to a limit current ILIM. As long as the collector current of BJT Q4A (which is about the same as the output current ID due to the second translinear loop Q4A, Q4B) is lower than the limit current ILIM, the first translinear loop Q1, Q2, Q3, Q4B effectively controls the output current ID to produce a result similar to that of the translinear loop 100 (FIG. 1), wherein ID=IA·IB/IC (equation 2, or the first piece of equation 3). However, as IC becomes relatively low and the first translinear loop tries to push the collector current IC4A of BJT Q4A (and, thus, the output current ID) above the limit current ILIM, the clamp BJT Q5 turns on and draws some of the current from IA away from the collector of BJT Q1 (thereby reducing the output current of the first translinear loop) until an equilibrium is established wherein IC4A is almost the same as the limit current ILIM. Under this condition, therefore, the second translinear loop Q4A, Q4B effectively controls the output current ID, wherein ID=IC4A=ILIM (the second piece of equation 3), thereby preventing the excessive current draw problem of translinear circuit 100 as IC approaches zero. This piecewise functionality enables the translinear circuit 102, unlike the translinear circuit 100, to be used to determine the allowable current through the pass FET of a hot swap controller based on both power-limiting (due to the first translinear loop Q1, Q2, Q3, Q4B) and current-limiting (due to the second translinear loop Q4A, Q4B).

However, even though the second translinear loop Q4A, Q4B controls the output current ID in a range of low values of IC, the first translinear loop Q1, Q2, Q3, Q4B is still active in such a manner that when IC reaches zero, the collector current of BJT Q1 also goes to zero, which creates a removable singularity in the first piece of the translinear loop equation. This singularity causes the translinear loop Q1, Q2, Q3, Q4B (when implemented with additional components, such as beta helpers, which are typically necessary, but not shown for simplicity) to oscillate unpredictably when IC is very small. (Additional descriptions related to the translinear circuit 102 can be found in U.S. Pat. No. 5,134,355 and in the aforementioned U.S. Pat. No. 7,352,231, since the translinear circuit 102 is a simplified version of the circuit in FIG. 8A of U.S. Pat. No. 5,134,355 and of the circuit in FIG. 2 of U.S. Pat. No. 7,352,231. U.S. Pat. No. 5,134,355 is assigned to the same assignee as the present invention and is incorporated in its entirety herein by reference.)

Yet another simple translinear circuit 104, shown in FIG. 3, eliminates the problem of the removable singularity (i.e. perturbs the singularity) in the translinear circuit 102 as well as the problem of the infinity in the translinear circuit 100. The translinear circuit 104 includes the clamp PNP BJT Q5 to form the linked translinear loops that implement the piecewise-polynomial-continuous equation 3. However, the translinear circuit 104 also has a current mirror 106 formed by N-channel MOSFETs M1 and M2. The current mirror 106 forces an additional current (proportional to the current through the clamp BJT Q5) through the BJT Q3. Consequently, even if the current IC approaches zero (the range in which the translinear loop Q4A-Q4B controls the output current ID), the collector current of BJT Q3 does not approach zero, thereby perturbing the removable singularity, i.e. preventing the translinear loop Q1-Q2-Q3-Q4B from encountering the 0/0 condition. Therefore, the translinear circuit 104 can be used to determine the allowable current through the pass FET of a hot swap controller based on both power-limiting and current-limiting without the potential for the unpredictable oscillation due to a removable singularity. (Additional description related to the translinear circuit 104 can be found in the aforementioned U.S. Pat. No. 7,352,231, since the translinear circuit 104 is a simplified version of the circuit in FIG. 6 of U.S. Pat. No. 7,352,231. Additionally, a version of the circuit in FIG. 6 of U.S. Pat. No. 7,352,231 is incorporated in the TPS2490 family of positive high-voltage power-limiting hot swap controllers available from Texas Instruments Incorporated.)

Continuing developments in electronic circuits have led to the necessity of operating with lower and lower supply voltages in order to minimize power usage. However, typical transistors must have sufficient voltage headroom (i.e. sufficient supply voltage available for use by the circuit) in order to operate. Although the translinear circuit 104 and variations thereof enable both current-limiting and power-limiting in most situations to ensure that the pass FET operates within a safe operating area (SOA), it has been discovered that at relatively low voltages (e.g. below about 2.8 volts) the translinear circuit 104 (when implemented with additional components, such as beta helpers, which are typically necessary, but not shown for simplicity) lacks adequate headroom for BJT Q4A to operate properly. Further evolution of translinear circuits is, therefore, required if they are to be used in newer lower voltage applications.

SUMMARY OF THE INVENTION

According to some embodiments, a translinear circuit that can operate in the newer lower voltage applications (e.g. a supply voltage between about 1.8 and about 2.8 volts in some cases) preferably includes a plurality of translinear elements forming at least two translinear loops. A current through a first one of the translinear elements represents a piecewise-polynomial-continuous function. The first translinear loop controls a first portion of the piecewise-polynomial-continuous function in a first area of operation. The second translinear loop controls a second portion of the piecewise-polynomial-continuous function in a second area of operation. A linking transistor is coupled to receive a current based on a current through a second one of the translinear elements and to drive at least a portion of a current through a third one of the translinear elements when in the second area of operation without reducing a current flow through another of the translinear elements. The second translinear element forms part of the second translinear loop and the third translinear element forms part of the first translinear loop.

In a more specific embodiment of the foregoing, the piecewise-polynomial-continuous function includes a division function. In which case, the linking transistor affects a denominator term of the division function and not a numerator term of the division function.

In some alternatives, the present invention is embodied in a method for implementing a piecewise-polynomial-continuous function in a translinear circuit. When in a first area of operation, an output current is produced based on a division function portion of the piecewise-polynomial-continuous function. On the other hand, when in a second area of operation, the output current is produced at about an effective limit value. Also, when in the second area of operation, current flow through a first translinear element is increased without drawing current away from a second translinear element. The first and second translinear elements form part of a translinear loop that implements the division function.

In other alternatives, the present invention is embodied in a method for implementing a piecewise-polynomial-continuous function represented by an output current provided by a first translinear element of a translinear circuit. The translinear circuit generally includes (but is not limited to) the first translinear element, at least second and third translinear elements, a control node and a clamp transistor. The translinear circuit also generally includes at least two translinear loops formed by the translinear elements. According to the method, a current is provided to the control node to which is coupled the clamp transistor and a reference current source. The current to the control node is based on a current through the second translinear element of the translinear circuit. When the current to the control node is below a limit value determined by the reference current source, the clamp transistor is maintained deactivated to cause the output current to be based on a first portion of the piecewise-polynomial-continuous function. The first portion is controlled by a first translinear loop of the translinear circuit. On the other hand, when the current to the control node is about at the limit value, a voltage is maintained at the control node to activate the clamp transistor to cause the output current to be based on a second portion of the piecewise-polynomial-continuous function. The second portion is controlled by a second translinear loop of the translinear circuit. While the clamp transistor is activated, the clamp transistor draws current through the third translinear element of the translinear circuit without drawing current away from another translinear element of the translinear circuit.

DETAILED DESCRIPTION OF THE INVENTION

Figure 4:
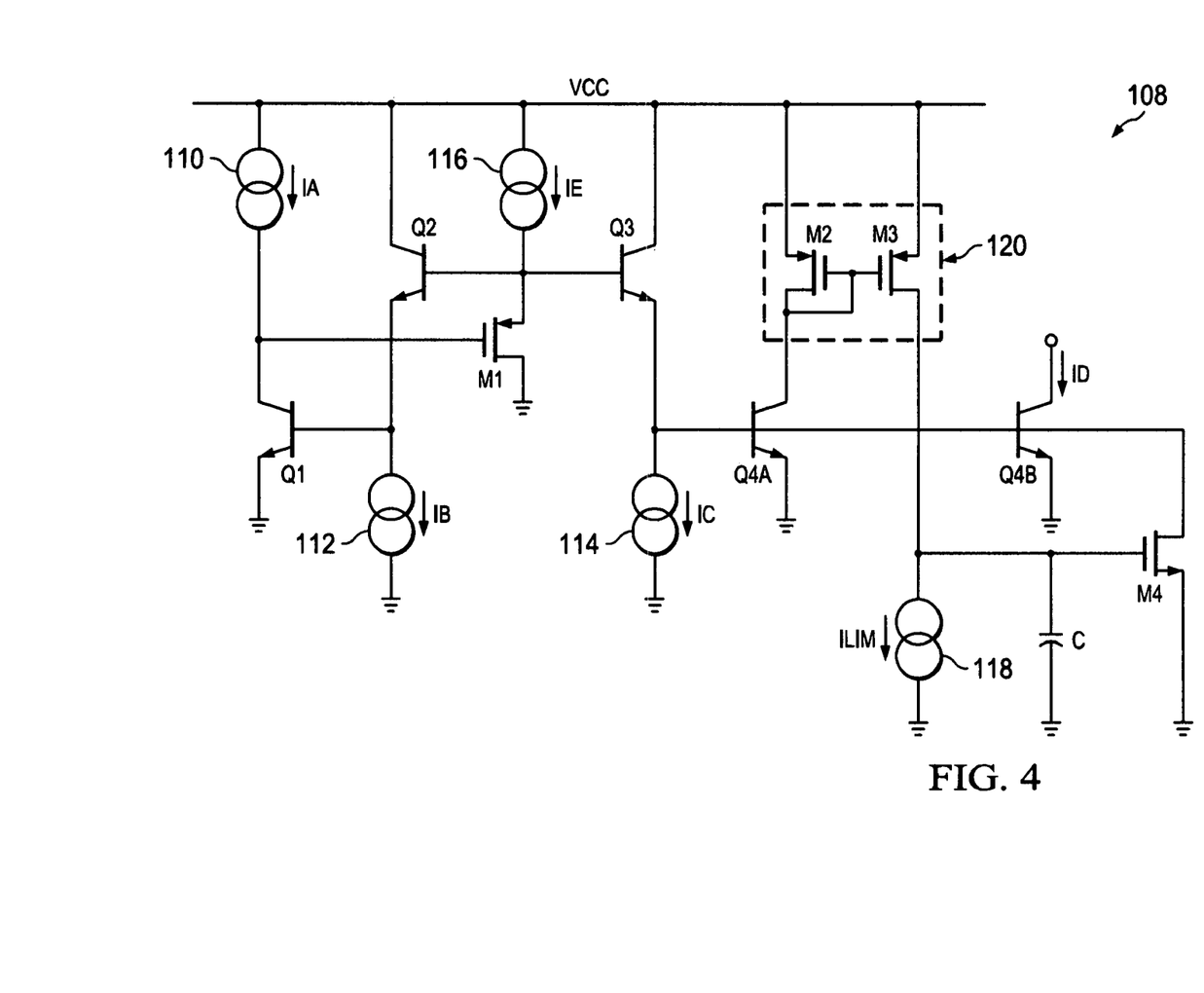
FIG. 4 is a simplified schematic diagram of a translinear circuit, according to an embodiment of the present invention.

A translinear circuit 108 in accordance with embodiments of the present invention, as shown in FIG. 4, implements a piecewise-polynomial-continuous function (and is capable of operating within relatively low headroom conditions). For example, the translinear circuit 108 can even operate within an overall circuit that can provide a supply voltage VCC down to about 1.8 volts.

In the illustrated embodiment, the translinear circuit 108 generally includes translinear elements (bipolar junction transistors—BJTs) Q1, Q2, Q3, Q4A and Q4B, MOSFET transistors M1, M2, M3 and M4 and a capacitor C. Input currents IA, IB, IC, IE and ILIM to the translinear circuit 108 are represented as being produced by current sources 110, 112, 114, 116 and 118, respectively, but are generally produced by the overall circuit into which the translinear circuit 108 is incorporated, e.g. a hot swap controller circuit. Additionally, an output of the translinear circuit 108 is generally represented by an output current ID, which represents the piecewise-polynomial-continuous function.

In the illustrated embodiment, the translinear elements Q1, Q2, Q3, Q4A and Q4B are NPN BJTs, the transistor M4 is an N-channel MOSFET (NMOS) clamp or link transistor, the transistor M1 is a relatively low threshold voltage (Vt) P-channel MOSFET (PMOS) beta helper and the transistors M2 and M3 are a PMOS current mirror 120. It is understood, however, that the present invention is not necessarily so limited. For example, an NPN BJT could be substituted for the NMOS clamp transistor M4. Additionally, the principle described herein for linking translinear loops could be applied to a translinear circuit containing PNP transistors (instead of the NPN BJTs Q1, Q2, Q3, Q4A and Q4B) and a PMOS or PNP clamp transistor (instead of the NMOS clamp transistor M4).

In the illustrated embodiment, the (upper) translinear elements Q2 and Q3 and the (lower) translinear elements Q1 and Q4B form a first translinear loop, in which the product of the collector currents of the (counterclockwise) translinear elements Q1 and Q2 are about equal (or approximately proportional) to the product of the collector currents of the (clockwise) translinear elements Q3 and Q4B. So the collector current of translinear element Q4B (output current ID) can be used to find the quotient in a division function for which the collector currents of translinear elements Q1 and Q2 are dividend (or numerator) terms and the collector current of translinear element Q3 is a divisor (or denominator) term. Additionally, the translinear elements Q4A and Q4B form a second translinear loop, in which the collector current of the translinear element Q4A is about equal (or proportional) to the collector current of the translinear element Q4B. Furthermore, the two translinear loops are linked by the clamp transistor M4, which affects the current through translinear element Q3 to limit the output current ID, as will be described below. Also, these relationships between the collector currents of the translinear elements Q1, Q2, Q3, Q4A and Q4B generally assume certain characteristics for the translinear elements Q1, Q2, Q3, Q4A and Q4B are held true, such as high betas, high Early voltages, equal emitter areas, etc. (For embodiments using MOS transistors, such assumptions preferably include no channel length modulation and equal width/length ratios.)

It is understood, however, that the present invention is not necessarily limited to the particular configuration shown. For example, the translinear loop linking technique described herein is applicable to embodiments having translinear loops containing more than four translinear elements, resulting in a division function having any desired number of numerator and denominator terms (see, for example, FIG. 6 below). Additionally, the current associated with any term in the denominator of the equation for the output can be clamped using this technique. By proper choice of the current (or node, term or translinear element) to clamp, the need to add circuitry to perturb a removable singularity can be eliminated, since there will be no 0/0 term, since the possibility of a singularity is eliminated. Furthermore, the linking technique could also be used to form a translinear circuit with more than two linked translinear loops (see, for example, FIG. 7 below).

In the illustrated embodiment, the linked translinear loops implement the piecewise-polynomial-continuous function of equation 3, which includes a division function portion in a first area of operation and a constant portion in a second area of operation. For the division function, the current through translinear element Q1 is determined by the current IA provided by the current source 110. Additionally, the current through translinear element Q2 is determined by the current IB provided by the current source 112. However, the current through translinear element Q3 is determined not only by the current IC provided by the current source 114, but also by the current through the clamp transistor M4, when activated or conducting. As a result, the first and second areas of operation are generally defined by whether the clamp transistor M4 is turned off or on, which generally corresponds to the output current ID being below or about equal to an effective limit value.

The effective limit value generally depends on the level of the limit current ILIM and the relative relationship between the current provided by the current mirror 120 from transistor M3, the current through the translinear element Q4A and the output current ID. Since the translinear elements Q4A and Q4B form the second translinear loop, the current drawn by translinear element Q4A is proportional to the current through the translinear element Q4B, which is the output current ID. Additionally, since the current through the translinear element Q4A is provided to the transistor M2 of the current mirror 120, the current produced by the current mirror 120 from transistor M3 is proportional to the current through the translinear element Q4A. Therefore, the output current ID is proportional to the current provided by the current mirror 120 from transistor M3 to a control node at the gate of the clamp transistor M4.

The current provided by the current mirror 120 from transistor M3 to the gate of the clamp transistor M4 is balanced against the limit current ILIM produced by reference current source 118. (The current source 118 preferably includes an appropriate circuitry, such as a current mirror having an output MOSFET that produces the limit current ILIM with a maximum nominal, or limit, value.) When the output current ID is below the effective limit value, then the current delivered by the transistor M3 is below the nominal value of the limit current ILIM. In this situation, therefore, the current source 118 pulls down the node between it and the transistors M3 and M4 until the output MOSFET in the current source 118 loses headroom and its current diminishes to equal the current delivered by the transistor M3. Additionally, the pull-down by the current source 118 causes the gate-source voltage of the clamp transistor M4 to be well below the threshold voltage thereof, which maintains the clamp transistor M4 off. As long as the clamp transistor M4 is off, it has little to no effect on the current through the translinear element Q3 and, thus, allows the output current ID to be based almost entirely on the division function portion of the piecewise-polynomial-continuous function.

When the output current ID rises to the effective limit value, on the other hand, then the current delivered by the transistor M3 rises about to the nominal value of the limit current ILIM. The current delivered by the transistor M3 may transiently exceed the nominal value of the limit current ILIM, but the capacitor C (which compensates the loop by altering the open loop gain and phase) enables the transient to settle to a steady state operating point at which the current delivered by the transistor M3 remains about equal to the nominal value of the limit current ILIM, since both the transistor M3 and the output MOSFET of the current mirror that generates the limit current ILIM are in saturation at this point. In this situation, therefore, the current source 118 no longer pulls down the gate of the clamp transistor M4, so the clamp transistor M4 turns on and begins conducting. Therefore, the effective limit value that defines the point between the first and second areas of operation is generally the level of the output current ID at which (or slightly above which) the clamp transistor M4 turns on.

In other words, since the output current ID increases with a decreasing current through translinear element Q3, and since the current through translinear element Q3 is the current IC as long as the clamp transistor M4 is off, then the clamp transistor M4 will turn on when the current IC decreases below a point at which the output current ID increases to the effective limit value that defines the point between the first and second areas of operation. In this manner, the current through translinear element Q3, i.e. the divisor (or denominator), is prevented from causing a singularity in the division function of the first translinear loop Q1, Q2, Q3, Q4B, since the clamp transistor M4 increases the current through translinear element Q3 when the current IC provided by the current source 114 decreases relatively low, or approaches zero. Furthermore, operation of the clamp transistor M4 prevents the output current ID from increasing significantly above the effective limit value, so the output is current-limited. Therefore, in the second area of operation, the output current ID is limited to the nominal value of the limit current ILIM (or the effective limit value, which is proportional to the nominal value of the limit current ILIM, depending on relative characteristics of some of the translinear elements).

Unlike in the prior art example shown in FIG. 2, the translinear circuit 108 does not force a dividend, or numerator, term to approach zero, as can happen for translinear element Q1 in FIG. 2. Additionally, the translinear circuit 108 does not require the addition of circuitry to perturb a removable singularity, as was done in the prior art circuit of FIG. 3, as discussed above.

In the prior art translinear circuit 104 of FIG. 3, an NMOS beta helper (not shown) is typically used at the node between the bases, or inputs, of translinear elements Q2 and Q3. Due to the low operating voltage requirements for the translinear circuit 108 in FIG. 4, however, the low threshold voltage PMOS (rather than NMOS) beta helper transistor M1 is connected between the bases of translinear elements Q2 and Q3 of the translinear circuit 108 in some embodiments of the present invention. If such a low headroom PMOS beta helper transistor were to be connected between the bases of the translinear elements Q2 and Q3 of the translinear circuit 104 in FIG. 3, however, then the PNP BJT (or PMOS) clamp Q5 would leave insufficient headroom for the translinear element Q4A in an application with as low an operating voltage requirement as is contemplated with the translinear circuit 108. The clamp transistor M4, on the other hand, enables operation of the translinear circuit 108 within such a low headroom situation.

Figure 5:
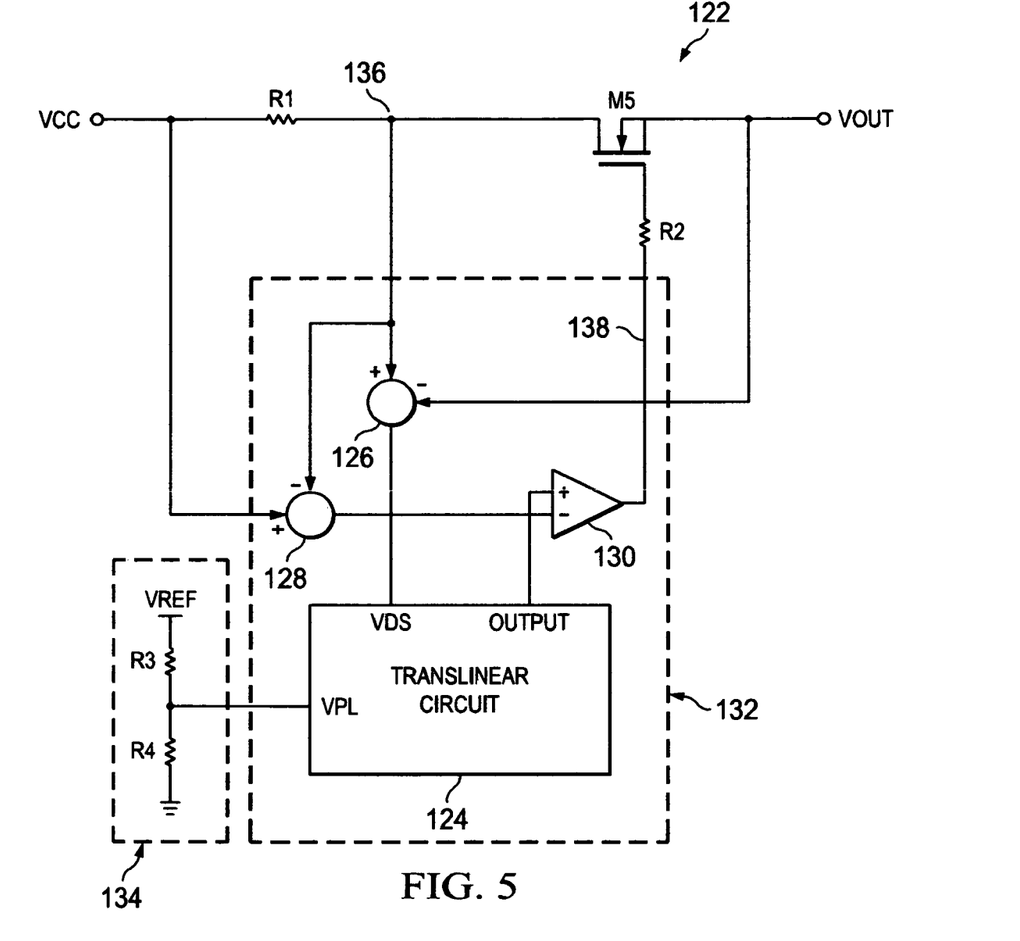
FIG. 5 is a simplified schematic diagram of a power-limiting hot swap controller incorporating the translinear circuit shown in FIG. 4, according to an embodiment of the present invention.

An example of a current-limiting and power-limiting hot swap controller 122, as shown in FIG. 5, generally incorporates a translinear circuit 124 and operates with a relatively low supply voltage VCC to produce an output voltage VOUT. The output voltage VOUT preferably powers a hot swap device, in which the hot swap controller 122 is included, when the hot swap device is inserted into a host electronic system. Under control of the translinear circuit 124, the hot swap controller 122 also limits the initial inrush of current into the overall hot swap device upon initial insertion into the host electronic system. Additionally, the translinear circuit 124 is preferably an embodiment of the translinear circuit 108 of FIG. 4. Furthermore, the supply voltage VCC may be as low as 1.8 to 2.0 volts.

Although the translinear circuit 124 is shown and described as being incorporated in the hot swap controller 122, it is understood that the present invention is not necessarily so limited, unless otherwise noted in the claims. In other words, even though the low-headroom/low-supply-voltage requirements of next-generation hot swap controllers led to the development of the present invention, embodiments of the present invention may be incorporated in any appropriate applications or environments.

In addition to the translinear circuit 124, the hot swap controller 122 generally includes a pass FET M5, a first voltage subtractor 126, a second voltage subtractor 128, an error amplifier 130 and resistors R1-R4. Other components for generating the reference voltage VREF, detecting a fault/error condition and determining completion of inrush, among other functions, may be included, but are not shown for simplicity.

The pass FET M5 limits the initial inrush of current from the supply voltage VCC to the output voltage VOUT and into the overall hot swap device. The translinear circuit 124, the voltage subtractors 126 and 128 and the error amplifier 130, among other components not shown, are preferably combined in an integrated circuit (IC) 132 that controls the pass FET M5 through an output at 138. (The resistor R2 between the output at 138 and the gate of the pass FET M5 is not always necessary, but may be included to control the rate at which the pass FET M5 can be turned off, e.g. when the host swap controller 122 encounters a fault condition.) The output of the IC 132 is generally based on inputs received from the supply voltage VCC, the output voltage VOUT, a voltage divider 134 (i.e. the resistors R3 and R4) and a node 136 between the resistor R1 and a drain of the pass FET M5.

The first voltage subtractor 126 receives a voltage from the node 136 (i.e. the drain of the pass FET M5) at a positive input and the output voltage VOUT (i.e. a source of the pass FET M5) at a negative input. The output of the first voltage subtractor 126 (i.e. the difference between these two voltages) is, thus, a voltage that represents the voltage drop across the pass FET M5. The output of the first voltage subtractor 126 is supplied to a drain-source voltage VDS input of the translinear circuit 124, which generates a current from this voltage for use within the translinear circuit 124 (e.g. by the current source 114, FIG. 4).

The resistors R3 and R4 are preferably selected so that the output of the voltage divider 134 is a voltage level that represents the maximum allowable power level for the pass FET M5. The selected resistance values of the resistors R3 and R4 are, thus, preferably based on the reference voltage VREF (a temperature independent reference voltage of known value), the limit current ILIM (internally fixed in the translinear circuit 124) and the desired thermal stress on the pass FET M5, depending on an allowed safe operating area (SOA). The output of the voltage divider 134 is supplied to a power level voltage VPL input of the translinear circuit 124, which generates a current from this voltage for use within the translinear circuit 124 (e.g. by the current source 110 or 112, FIG. 4).

Given the currents based on the maximum allowable power level at VPL and the actual voltage across the pass FET M5 at the drain-source voltage VDS input (and the relationship: current equals power divided by voltage), the translinear circuit 124 produces an OUTPUT indicative of the maximum allowable current level based on the piecewise-polynomial-continuous function described above. In this case, therefore, the current based on the power level voltage VPL input is used as one of the dividend or numerator terms (i.e. the current IA provided by the current source 110 or the current IB provided by the current source 112, FIG. 4) and the current based on the drain-source voltage VDS input is used as the divisor or denominator term (i.e. the current IC provided by the current source 114). (The unused dividend or numerator term is preferably fixed to a known constant current value appropriate for the application.) The OUTPUT of the translinear circuit 124 is preferably a voltage based on the output current ID, i.e. the maximum allowable current level.

The second voltage subtractor 128 receives the supply voltage VCC at a positive input and the voltage from the node 136 at a negative input. The output of the second voltage subtractor 128 (i.e. the difference between these two voltages) is, thus, a voltage that represents the voltage drop across the resistor R1. If the resistance of the resistor R1 is known, then the voltage drop across the resistor R1 is indicative of the actual current through the resistor R1, which is approximately the current through the pass FET M5.

The output of the second voltage subtractor 128 (indicative of the actual current through the pass FET M5) is supplied to a negative input of the error amplifier 130. The OUTPUT of the translinear circuit 124 (indicative of the maximum allowable current for the pass FET M5) is supplied to a positive input of the error amplifier 130. The error amplifier 130, thus, generates a high side (above the supply voltage VCC) gate drive for the pass FET M5 based on a comparison of the actual current and the allowable current through the pass FET M5. If the actual current is less than the allowable current, the error amplifier 130 turns the gate of pass FET M5 fully on, because there is no power overload condition in this case. On the other hand, if the actual current through the pass FET M5 rises to the level of the allowed current, then the output of the error amplifier 130 is regulated to ensure that the actual current does not further rise (except transiently) above the allowed current. Incorporated into the host swap controller 122 in this manner, therefore, the translinear circuit 124 enables both current-limiting and power-limiting to ensure that the pass FET M5 operates within a safe operating area (SOA). Additionally, selection of the resistance value of the resistor R1 (external to the IC 132), given a known limit current ILIM within the translinear circuit 124 (FIG. 4), in effect sets the maximum current level for the current through the pass FET M5.

Figure 6:
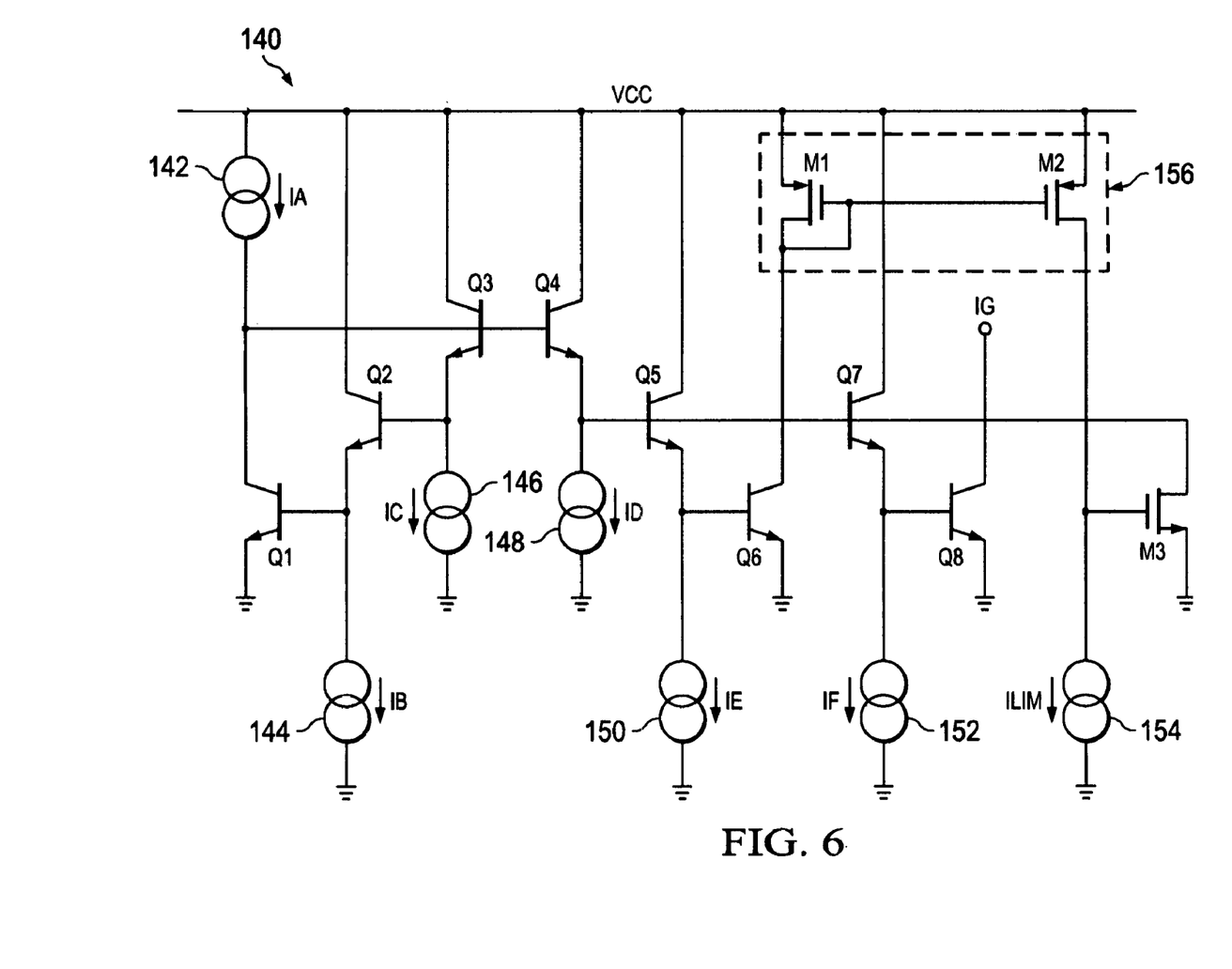
FIG. 6 is a simplified schematic diagram of another translinear circuit, according to another embodiment of the present invention.

Another translinear circuit 140 (in accordance with alternative embodiments of the present invention for implementing a piecewise-polynomial-continuous function using a translinear loop linking technique similar to that described with reference to FIG. 4) is shown in FIG. 6. In the illustrated embodiment, the translinear circuit 140 generally includes translinear elements (bipolar junction transistors—BJTs) Q1, Q2, Q3, Q4, Q6, Q7 and Q8 and MOSFET transistors M1, M2 and M3. Input currents IA, IB, IC, ID, IE, IF and ILIM to the translinear circuit 140 are represented as being produced by current sources 142, 144, 146, 148, 150, 152 and 154, respectively, but are generally produced by the overall circuit into which the translinear circuit 140 is incorporated. Additionally, an output of the translinear circuit 140 is generally represented by an output current IG, which represents the piecewise-polynomial-continuous function. Furthermore, the translinear circuit 140 may include additional components (not shown), such as beta helpers, compensation capacitors, etc.

In the illustrated embodiment, the translinear elements Q1-Q8 are NPN BJTs, the transistor M3 is an N-channel MOSFET (NMOS) clamp or link transistor and the transistors M1 and M2 are a PMOS current mirror 156. It is understood, however, that the present invention is not necessarily so limited. For example, an NPN BJT could be substituted for the NMOS clamp transistor M3. Additionally, the principle described herein for linking translinear loops could be applied to a translinear circuit containing PNP transistors (instead of the NPN BJTs Q1-Q8) and a PMOS or PNP clamp transistor (instead of the NMOS clamp transistor M3).

In the illustrated embodiment, the translinear elements Q1-Q4, Q7 and Q8 form a first translinear loop, in which the product of the collector currents of the (counterclockwise) translinear elements Q1, Q2 and Q3 are about equal (or approximately proportional) to the product of the collector currents of the (clockwise) translinear elements Q4, Q7 and Q8. So, in a first area of operation, the collector current of translinear element Q8 (output current IG) can be used to find the quotient in a first division function for which the collector currents of translinear elements Q1, Q2 and Q3 are dividend (or numerator) terms and the collector currents of translinear elements Q4 and Q7 are divisor (or denominator) terms. Additionally, the translinear elements Q5, Q6, Q7 and Q8 form a second translinear loop, in which the product of the collector currents of the (counterclockwise) translinear elements Q5 and Q6 are about equal (or approximately proportional) to the product of the collector currents of the (clockwise) translinear elements Q7 and Q8. So, in a second area of operation, the collector current of translinear element Q8 (output current IG) can be used to find a quotient in a second division function for which the collector currents of translinear elements Q5 and Q6 are dividend (or numerator) terms and the collector current of translinear element Q7 is a divisor (or denominator) term. Furthermore, the two translinear loops are linked by the clamp transistor M3, which affects the current through translinear element Q4 to limit the output current IG, as will be described below. Thus, the piecewise-polynomial-continuous function for this embodiment includes the first and second division functions in the first and second areas of operation, respectively. Also, these relationships between the collector currents of the translinear elements Q1-Q8 generally assume certain characteristics for the translinear elements Q1-Q8 are held true, such as high betas, high Early voltages, equal emitter areas, etc. (For embodiments using MOS transistors, such assumptions preferably include no channel length modulation and equal width/length ratios.)

Similar to the clamp transistor M4 and the translinear element Q3 of FIG. 4, when the clamp transistor M3 is off (deactivated, not conducting), it has little to no effect on the current through the translinear element Q4. In this case, the current through the translinear element Q4 is the current ID due to the current source 148, and the output current IG is controlled by the first translinear loop (Q1-Q4, Q7 and Q8). On the other hand, when the clamp transistor M3 is on (activated, conducting), it draws current through the translinear element Q4. The current drawn by the clamp transistor M3 is in addition to the current ID. In this case, the output current IG is controlled by the second translinear loop (Q5, Q6, Q7 and Q8).

As a result, similar to the embodiment of FIG. 4, the first and second areas of operation are generally defined by whether the clamp transistor M3 is turned off or on. Due to the interaction of the current mirror 156 and the current source 154 (similar to that of the current mirror 120 and the current source 118, described above), the on/off state of the clamp transistor M3 generally corresponds to the current through the translinear element Q6 being below or about equal to a maximum or nominal limit value of the limit current ILIM.

Due to the piecewise-polynomial-continuous function having two division functions instead of having a division function and a constant function, as is the case for the embodiment of FIG. 4, the first and second areas of operation for the translinear circuit 140 do not correspond to the output current IG simply being below or about equal to an effective limit value that is based on the maximum level of the limit current ILIM, unless the currents IE and IF (or the ratio between them) are constants. Instead, the second division function causes the first and second areas of operation to correspond to the output current IG being below or about equal to a product of the maximum level of the limit current ILIM and the current IE divided by the current IF. So the first and second areas of operation may correspond to the output current IG being below or about equal to an effective limit value that is directly proportional solely to the maximum level of the limit current ILIM only if the ratio of the currents IE and IF is a constant.

Although it is not necessarily so specifically limited, the translinear circuit 140 can be used to prevent a singularity in a division function of a piecewise-polynomial-continuous function, e.g. by careful selection of a value or range for the current IF, and possibly also for the current IE. Therefore, the translinear circuit 140 can potentially be used in applications requiring power-limiting and current-limiting, as is explained herein for the translinear circuit 108 (FIG. 4), e.g. by selecting constant values or ratios or acceptable ranges for some of the currents. With the ability to set such values for an IC incorporating the translinear circuit 140, a circuit designer may have added flexibility in defining a curve for an allowable current level. Additionally, the translinear circuit 140 also potentially has uses in other applications, such as in power factor correction, among others.

Unlike in the prior art example shown in FIG. 2, the translinear circuit 140 does not force a dividend, or numerator, term (in either of the two division functions) to approach zero, as can happen for translinear element Q1 in FIG. 2. Additionally, the translinear circuit 140 does not require the addition of circuitry to perturb a removable singularity, as was done in the prior art circuit of FIG. 3, as discussed above.

Figure 7:
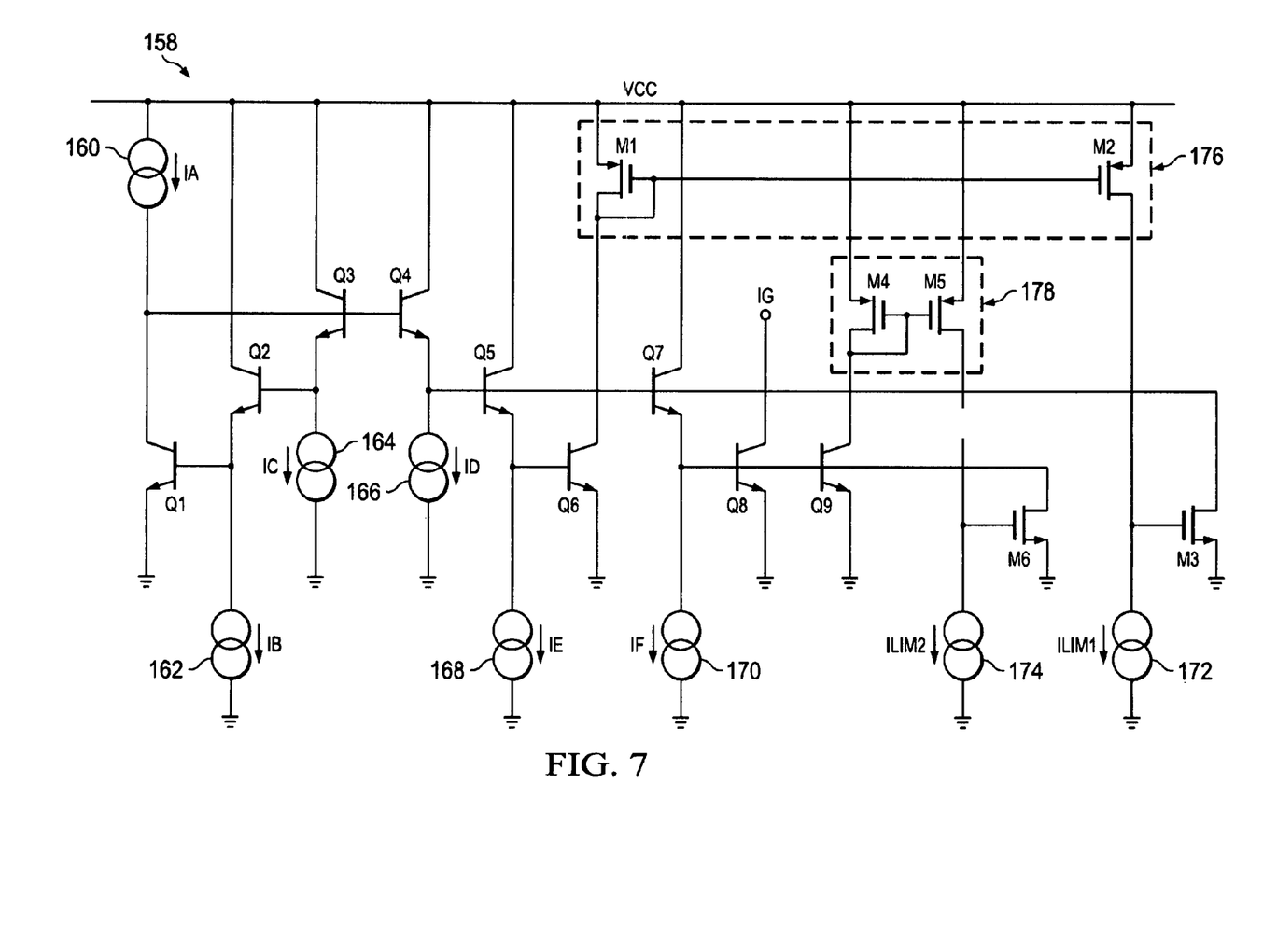
FIG. 7 is a simplified schematic diagram of yet another translinear circuit, according to another embodiment of the present invention.

Another translinear circuit 158 (in accordance with alternative embodiments of the present invention for implementing a piecewise-polynomial-continuous function using a translinear loop linking technique similar to that described with reference to FIG. 4) is shown in FIG. 7. In the illustrated embodiment, the translinear circuit 158 generally includes translinear elements (bipolar junction transistors—BJTs) Q1, Q2, Q3, Q4, Q6, Q7, Q8 and Q9 and MOSFET transistors M1, M2, M3, M4, M5 and M6. Input currents IA, IB, IC, ID, IE, IF, ILIM1 and ILIM2 to the translinear circuit 158 are represented as being produced by current sources 160, 162, 164, 166, 168, 170, 172 and 174, respectively, but are generally produced by the overall circuit into which the translinear circuit 158 is incorporated. Additionally, an output of the translinear circuit 158 is generally represented by an output current IG, which represents the piecewise-polynomial-continuous function. Furthermore, the translinear circuit 158 may include additional components (not shown), such as beta helpers, compensation capacitors, etc.

In the illustrated embodiment, the translinear elements Q1-Q9 are NPN BJTs, the transistors M3 and M6 are N-channel MOSFET (NMOS) clamp or link transistors, the transistors M1 and M2 are a first PMOS current mirror 176 and the transistors M4 and M5 are a second PMOS current mirror 178. It is understood, however, that the present invention is not necessarily so limited. For example, NPN BJTs could be substituted for the NMOS clamp transistors M3 and M6.

Additionally, the principle described herein for linking translinear loops could be applied to a translinear circuit containing PNP transistors (instead of the NPN BJTs Q1-Q9) and PMOS or PNP clamp transistors (instead of the NMOS clamp transistors M3 and M6).

In the illustrated embodiment, the translinear elements Q1-Q4, Q7 and Q8 form a first translinear loop, in which the product of the collector currents of the (counterclockwise) translinear elements Q1, Q2 and Q3 are about equal (or approximately proportional) to the product of the collector currents of the (clockwise) translinear elements Q4, Q7 and Q8. So, in a first area of operation, the collector current of translinear element Q8 (output current IG) can be used to find the quotient in a first division function for which the collector currents of translinear elements Q1, Q2 and Q3 are dividend (or numerator) terms and the collector currents of translinear elements Q4 and Q7 are divisor (or denominator) terms. Additionally, the translinear elements Q5, Q6, Q7 and Q8 form a second translinear loop, in which the product of the collector currents of the (counterclockwise) translinear elements Q5 and Q6 are about equal (or approximately proportional) to the product of the collector currents of the (clockwise) translinear elements Q7 and Q8. So, in a second area of operation, the collector current of translinear element Q8 (output current IG) can be used to find a quotient in a second division function for which the collector currents of translinear elements Q5 and Q6 are dividend (or numerator) terms and the collector current of translinear element Q7 is a divisor (or denominator) term. Also, the translinear elements Q8 and Q9 form a third translinear loop, in which the collector current of the (counterclockwise) translinear element Q8 is about equal (or approximately proportional) to the collector current of the (clockwise) translinear element Q9.

Furthermore, the first and second translinear loops are linked by the first clamp transistor M3, which affects the current through translinear element Q4 to limit the output current IG, as will be described below. Additionally, all three translinear loops are linked by the second clamp transistor M6, which affects the current through translinear element Q7 also to limit the output current IG, as will also be described below. Thus, the piecewise-polynomial-continuous function for this embodiment includes the first and second division functions in the first and second areas of operation, respectively, and a constant portion in a third area of operation. Also, these relationships between the collector currents of the translinear elements Q1-Q9 generally assume certain characteristics for the translinear elements Q1-Q9 are held true, such as high betas, high Early voltages, equal emitter areas, etc. (For embodiments using MOS transistors, such assumptions preferably include no channel length modulation and equal width/length ratios.)

Similar to the clamp transistor M4 and the translinear element Q3 of FIG. 4, when the first clamp transistor M3 is off (deactivated, not conducting), it has little to no effect on the current through the translinear element Q4. Additionally, when the second clamp transistor M6 is off (deactivated, not conducting), it has little to no effect on the current through the translinear element Q7. In this case, the currents through the translinear elements Q4 and Q7 are the currents ID and IF, respectively, due to the current source 166 and 170, respectively, and the output current IG is controlled by the first translinear loop (Q1-Q4, Q7 and Q8). On the other hand, when the first clamp transistor M3 is on (activated, conducting), it draws current through the translinear element Q4. The current drawn by the first clamp transistor M3 is in addition to the current ID. In this case, as long as the second clamp transistor M6 is still off, the output current IG is controlled by the second translinear loop (Q5, Q6, Q7 and Q8). However, when the second clamp transistor M6 is on (activated, conducting), it draws current through the translinear element Q7. The current drawn by the second clamp transistor M6 is in addition to the current IF. In this case, regardless of whether the first clamp transistor M3 is off or on, the output current IG is controlled by the third translinear loop (Q8 and Q9).

As a result, the first, second and third areas of operation are generally defined by whether the first and second clamp transistors M3 and M6 are turned off or on. In particular, when both of the first and second clamp transistors M3 and M6 are turned off, the translinear circuit 158 is in the first area of operation. On the other hand, when the first clamp transistor M3 is turned on and the second clamp transistor M6 is turned off, the translinear circuit 158 is in the second area of operation. Additionally, regardless of the on/off state of the first clamp transistor M3, when the second clamp transistor M6 is turned on, the translinear circuit 158 is in the third area of operation.

Due to the interaction of the first current mirror 176 and the current source 172 (similar to that of the current mirrors 156 and 120 and the current sources 154 and 118, respectively, described above), the on/off state of the first clamp transistor M3 generally corresponds to the current through the translinear element Q6 being below or about equal to a maximum or nominal limit value of the first limit current ILIM1. Similarly, due to the interaction of the second current mirror 178 and the current source 174, the on/off state of the second clamp transistor M6 generally corresponds to the current through the translinear element Q9 being below or about equal to a maximum or nominal limit value of the second limit current ILIM2.

In this embodiment, due to the first and second areas of operation both having division functions instead of having a division function and a constant function, the first and second areas of operation for the translinear circuit 158 do not correspond to the output current IG simply being below or about equal to an effective limit value that is based on the maximum level of the first limit current ILIM1, unless the currents IE and IF (or the ratio between them) are constants. Instead, the second division function causes the first and second areas of operation to correspond to the output current IG being below or about equal to a product of the maximum level of the first limit current ILIM1 and the current IE divided by the current IF. So the first and second areas of operation may correspond to the output current IG being below or about equal to an effective limit value that is directly proportional solely to the maximum level of the limit current ILIM only if the ratio of the currents IE and IF is a constant. On the other hand, since the third area of operation implements a constant function, the translinear circuit 158 is in the first or second area of operation when the output current IG is below an effective limit value that is based on the maximum level of the second limit current ILIM2, and the translinear circuit 158 is in the third area of operation when the output current IG is about equal to the effective limit value.

Since the translinear circuit 158 can add current to both denominator terms (the collector currents of the translinear elements Q4 and Q7) of both division function portions of the piecewise-polynomial-continuous function represented by the output current IG, the translinear circuit 158 can be used to prevent a singularity in a piecewise-polynomial-continuous function having two division functions. Therefore, the translinear circuit 158 can potentially be used in applications requiring power-limiting and current-limiting, as is explained herein for the translinear circuit 108 (FIG. 4), e.g. by selecting constant values or ratios or acceptable ranges for some of the currents. With the ability to set such values for an IC incorporating the translinear circuit 158, a circuit designer may have added flexibility in defining a more detailed curve for an allowable current level. Additionally, the translinear circuit 158 also potentially has uses in other applications. Furthermore, by extension of the design, a piecewise-polynomial-continuous function having more than two or three portions can be implemented.

Unlike in the prior art example shown in FIG. 2, the translinear circuit 158 does not force a dividend, or numerator, term (in either of the two division functions) to approach zero, as can happen for translinear element Q1 in FIG. 2. Additionally, the translinear circuit 158 does not require the addition of circuitry to perturb a removable singularity, as was done in the prior art circuit of FIG. 3, as discussed above.

Although the present invention has been described in detail, it should be understood that various changes, substitutions and alterations can be made thereto without departing from the spirit and scope of the invention as defined by the appended claims.

The invention claimed is:

1. An electronic circuit comprising
a plurality of translinear elements forming a first translinear loop and a second translinear loop, a current through a first one of the translinear elements representing a piecewise-polynomial-continuous function, the first translinear loop controlling a first portion of the piecewise-polynomial-continuous function in a first area of operation and the second translinear loop controlling a second portion of the piecewise-polynomial-continuous function in a second area of operation; and
a linking transistor coupled to receive a current based on a current through a second one of the translinear elements and to drive at least a portion of a current through a third one of the translinear elements when in the second area of operation without reducing a current flow through another of the translinear elements, the second translinear element forming part of the second translinear loop and the third translinear element forming part of the first translinear loop.

2. The electronic circuit of claim 1, wherein:
the current through the second translinear element varies substantially linearly with the current through the first translinear element.

3. The electronic circuit of claim 2, wherein:
the current through the first translinear element varies substantially inversely with the current through the third translinear element.

4. The electronic circuit of claim 1, wherein:
the piecewise-polynomial-continuous function includes a division function; and
the linking transistor affects a denominator term of the division function and not a numerator term of the division function.

5. The electronic circuit of claim 1, wherein:
the first translinear loop comprises the first and third translinear elements and fourth and fifth translinear elements;
inputs of the third and fourth translinear elements are connected together;
the first translinear element generates an output current;
in the first portion of the piecewise-polynomial-continuous function, the output current is about equal to a product of currents through the fourth and fifth translinear elements divided by the current through the third translinear element;
the first translinear loop controls the output current in the first area of operation, in which the output current is below a limit value;
the second translinear loop comprises the first and second translinear elements;
inputs of the first and second translinear elements are connected together;
in the second portion of the piecewise-polynomial-continuous function, the output current is about equal to the current through the second translinear element; and
the second translinear loop controls the output current in the second area of operation, in which the output current is about equal to the limit value.

6. The electronic circuit of claim 1, wherein:
the first and second translinear loops operate with a supply voltage between about 1.8 and about 2.8 volts.

7. The electronic circuit of claim 1, further comprising:
a MOSFET that limits an initial inrush of current into a hot swap device; and
a hot swap controller that uses the translinear loops to control and protect the MOSFET.

8. The electronic circuit of claim 1, further comprising:
a PMOS beta helper transistor connected between bases of upper ones of the translinear elements of the first translinear loop.

9. The electronic circuit of claim 1, wherein:
the first translinear loop comprises the first and third translinear elements and fourth, fifth, sixth and seventh translinear elements;
inputs of the third and fourth translinear elements are connected together;
the second translinear loop comprises the first, second and seventh translinear elements and an eighth translinear element;
inputs of the seventh and eighth translinear elements are connected together;
the first translinear element generates an output current;
in the first portion of the piecewise-polynomial-continuous function, the output current is about equal to a product of currents through the fourth, fifth and sixth translinear elements divided by a product of the current through the third translinear element and a current through the seventh translinear element;
in the second portion of the piecewise-polynomial-continuous function, the output current is about equal to a product of the current through the second translinear element and a current through the eighth translinear element divided by the current through the seventh translinear element; and
the current through the second translinear element is balanced against a limit current with a maximum limit value.

10. The electronic circuit of claim 1, wherein:
the plurality of translinear elements also form a third translinear loop, which controls a third portion of the piecewise-polynomial-continuous function in a third area of operation;
the electronic circuit further comprises a second linking transistor coupled to receive a current based on a current through a fourth one of the translinear elements and to drive at least a portion of a current through a fifth one of the translinear elements when in the third area of operation without reducing a current flow through another of the translinear elements,
the first translinear loop comprises the first, third and fifth translinear elements and sixth, seventh and eighth translinear elements;

inputs of the third and sixth translinear elements are connected together;

the second translinear loop comprises the first, second and fifth translinear elements and a ninth translinear element;

inputs of the fifth and ninth translinear elements are connected together;

the third translinear loop comprises the first and fourth translinear elements;

inputs of the first and fourth translinear elements are connected together;

the first translinear element generates an output current;

in the first portion of the piecewise-polynomial-continuous function, the output current is about equal to a product of currents through the sixth, seventh and eighth translinear elements divided by a product of the currents through the third and fifth translinear elements;

in the second portion of the piecewise-polynomial-continuous function, the output current is about equal to a product of the current through the second translinear element and a current through the ninth translinear element divided by the current through the fifth translinear element;

the current through the second translinear element is balanced against a first limit current with a first maximum limit value;

in the third portion of the piecewise-polynomial-continuous function, the output current is about equal to the current through the fourth translinear element; and the current through the fourth translinear element is balanced against a second limit current with a second maximum limit value.

11. A method for implementing a piecewise-polynomial-continuous function represented by an output current provided by a first translinear element of a translinear circuit, comprising:

providing a current to a control node to which is coupled a clamp transistor and a reference current source, the current to the control node being based on a current through a second translinear element of the translinear circuit;

when the current to the control node is below a limit value determined by the reference current source, maintaining the clamp transistor deactivated to cause the output current to be based on a first portion of the piecewise-polynomial-continuous function, the first portion being controlled by a first translinear loop of the translinear circuit;

when the current to the control node is about at the limit value, maintaining a voltage at the control node to activate the clamp transistor to cause the output current to be based on a second portion of the piecewise-polynomial-continuous function, the second portion being controlled by a second translinear loop of the translinear circuit; and while the clamp transistor is activated, the clamp transistor drawing current through a third translinear element of the translinear circuit without drawing current away from another translinear element of the translinear circuit.

12. The method of claim 11, further comprising:
varying the current through the second translinear element substantially linearly with the output current provided by the first translinear element.

13. The method of claim 12, further comprising:
varying the current through the first translinear element substantially inversely with the current through the third translinear element.

14. The method of claim 11, wherein:
the first translinear loop comprises the first and third translinear elements, and fourth and fifth translinear elements;

inputs of the third and fourth translinear elements are connected together;

in the first portion of the piecewise-polynomial-continuous function, the output current is about equal to a product of currents through the fourth and fifth translinear elements divided by the current through the third translinear element;

the first translinear loop controls the output current in a first area of operation, in which the output current is below an effective limit value;

the second translinear loop comprises the first and second translinear elements;

inputs of the first and second translinear elements are connected together;

in the second portion of the piecewise-polynomial-continuous function, the output current is about equal to the current through the second translinear element; and the second translinear loop controls the output current in a second area of operation, in which the output current is about equal to the effective limit value.

15. The method of claim 14, wherein:
a low headroom PMOS beta helper transistor is connected between bases of the second and third translinear elements.

16. The method of claim 11, further comprising:
operating the translinear circuit with a supply voltage between about 1.8 and 2.8 volts.

17. The method of claim 11, wherein:
the first translinear loop comprises the first and third translinear elements and fourth, fifth, sixth and seventh translinear elements;

inputs of the third and fourth translinear elements are connected together;

the second translinear loop comprises the first, second and seventh translinear elements and an eighth translinear element;

inputs of the seventh and eighth translinear elements are connected together;

in the first portion of the piecewise-polynomial-continuous function, the output current is about equal to a product of currents through the fourth, fifth and sixth translinear elements divided by a product of the current through the third translinear element and a current through the seventh translinear element;

in the second portion of the piecewise-polynomial-continuous function, the output current is about equal to a product of the current through the second translinear element and a current through the eighth translinear element divided by the current through the seventh translinear element; and the current through the second translinear element is balanced against a limit current with a maximum limit value.

18. The method of claim 11, further comprising:
providing a current to a second control node to which is coupled a second clamp transistor and a second reference current source, the current to the second control node being based on a current through a fourth translinear element of the translinear circuit;

when the current to the second control node is below a second limit value determined by the second reference current source, maintaining the second clamp transistor deactivated to cause the output current to be based on the first or second portion of the piecewise-polynomial-continuous function;

when the current to the second control node is about at the second limit value, maintaining a voltage at the second control node to activate the second clamp transistor to cause the output current to be based on a third portion of the piecewise-polynomial-continuous function, the third portion being controlled by a third translinear loop of the translinear circuit; and while the second clamp transistor is activated, the second clamp transistor drawing current through a fifth translinear element of the translinear circuit without drawing current away from another translinear element of the translinear circuit;

and wherein:

the first translinear loop comprises the first, third and fifth translinear elements and sixth, seventh and eighth translinear elements;

inputs of the third and sixth translinear elements are connected together;

the second translinear loop comprises the first, second and fifth translinear elements and a ninth translinear element;

inputs of the fifth and ninth translinear elements are connected together;

the third translinear loop comprises the first and fourth translinear elements;

inputs of the first and fourth translinear elements are connected together;

in the first portion of the piecewise-polynomial-continuous function, the output current is about equal to a product of currents through the sixth, seventh and eighth translinear elements divided by a product of the currents through the third and fifth translinear elements;

in the second portion of the piecewise-polynomial-continuous function, the output current is about equal to a product of the current through the second translinear element and a current through the ninth translinear element divided by the current through the fifth translinear element;

the current through the second translinear element is balanced against a first limit current with a first maximum limit value;

in the third portion of the piecewise-polynomial-continuous function, the output current is about equal to the current through the fourth translinear element; and the current through the fourth translinear element is balanced against a second limit current with a second maximum limit value.

19. A method for implementing a piecewise-polynomial-continuous function in a translinear circuit, comprising:

when in a first area of operation, producing an output current based on a division function portion of the piecewise-polynomial-continuous function;

when in a second area of operation, producing the output current at about an effective limit value; and when in the second area of operation, increasing current flow through a first translinear element without drawing current away from a second translinear element, the first and second translinear elements forming part of a translinear loop that implements the division function.

20. The method of claim 19, further comprising:

operating the translinear circuit with a supply voltage between about 1.8 and 2.8 volts.

* * * * *